(12) United States Patent
Kurihara

(10) Patent No.: US 10,515,839 B2
(45) Date of Patent: Dec. 24, 2019

(54) METHOD FOR MANUFACTURING SEMICONDUCTOR DEVICE

(71) Applicant: MITSUI CHEMICALS TOHCELLO, INC., Chiyoda-ku, Tokyo (JP)

(72) Inventor: Hiroyoshi Kurihara, Nagoya (JP)

(73) Assignee: MITSUI CHEMICALS TOHCELLO, INC., Chiyoda-Ku, Tokyo (JP)

( * ) Notice: Subject to any disclaimer, the term of this patent is extended or adjusted under 35 U.S.C. 154(b) by 0 days.

(21) Appl. No.: 16/319,874

(22) PCT Filed: Jul. 20, 2017

(86) PCT No.: PCT/JP2017/026294
§ 371 (c)(1),
(2) Date: Feb. 1, 2019

(87) PCT Pub. No.: WO2018/021145
PCT Pub. Date: Feb. 1, 2018

(65) Prior Publication Data
US 2019/0267273 A1   Aug. 29, 2019

(30) Foreign Application Priority Data

Jul. 26, 2016 (JP) ................. 2016-146134

(51) Int. Cl.
*H01L 21/68* (2006.01)
*H01L 21/683* (2006.01)
(Continued)

(52) U.S. Cl.
CPC ............ *H01L 21/6835* (2013.01); *C09J 9/02* (2013.01); *C09J 133/08* (2013.01);
(Continued)

(58) Field of Classification Search
CPC ................. H01L 24/13; H01L 21/6835; H01L 21/30625; C09J 9/02; C09J 133/08
See application file for complete search history.

(56) References Cited

U.S. PATENT DOCUMENTS

2012/0003470 A1   1/2012  Kamiya et al.
2013/0273361 A1  10/2013  Kamiya et al.
(Continued)

FOREIGN PATENT DOCUMENTS

JP   2008-255345 A   10/2008
JP   2009-260332 A   11/2009
(Continued)

OTHER PUBLICATIONS

International Search Report (PCT/ISA/210) dated Oct. 10, 2017, by the Japan Patent Office as the International Searching Authority for International Application No. PCT/JP2017/026294.
Written Opinion (PCT/ISA/237) dated Oct. 10, 2017, by the Japan Patent Office as the International Searching Authority for International Application No. PCT/JP2017/026294.

*Primary Examiner* — Matthew L Reames
(74) *Attorney, Agent, or Firm* — Buchanan, Ingersoll & Rooney PC

(57) ABSTRACT

A method for manufacturing a semiconductor device includes at least the following three steps. A step (A) of preparing a structure including a semiconductor wafer having a circuit-formed surface and an adhesive film attached to the circuit-formed surface side of the semiconductor wafer. A step (B) of back grinding a surface on a side opposite to the circuit-formed surface side of the semiconductor wafer. A step (C) of radiating ultraviolet rays to the adhesive film and then removing the adhesive film from the semiconductor wafer. In addition, as the adhesive film, an adhesive film having a base material layer, an antistatic layer, and an adhesive resin layer including a conductive additive in this order is used, and the adhesive film is used so that the (Continued)

adhesive resin layer faces the circuit-formed surface side of the semiconductor wafer.

11 Claims, 1 Drawing Sheet

(51) Int. Cl.
  *C09J 9/02* (2006.01)
  *C09J 133/08* (2006.01)
  *H01L 23/00* (2006.01)
  *H01L 21/306* (2006.01)
(52) U.S. Cl.
  CPC ........ *H01L 21/30625* (2013.01); *H01L 24/13* (2013.01); *H01L 2224/13147* (2013.01); *H01L 2924/014* (2013.01)

(56) References Cited

U.S. PATENT DOCUMENTS

| | | | |
|---|---|---|---|
| 2014/0162434 A1 | 6/2014 | Shiga et al. | |
| 2017/0323820 A1* | 11/2017 | Tamura | B32B 27/00 |

FOREIGN PATENT DOCUMENTS

| | | |
|---|---|---|
| JP | 2011-210944 A | 10/2011 |
| JP | 2011-216513 A | 10/2011 |
| JP | 2012-017377 A | 1/2012 |
| JP | 2014-133858 A | 7/2014 |
| JP | 2015-115385 A | 6/2015 |
| WO | 2016/063917 A1 | 4/2016 |

* cited by examiner

100

100

METHOD FOR MANUFACTURING SEMICONDUCTOR DEVICE

TECHNICAL FIELD

The present invention relates to a method for manufacturing a semiconductor device.

BACKGROUND ART

Among steps for manufacturing a semiconductor device, in a step of grinding a semiconductor wafer, an adhesive film is attached to the semiconductor wafer in order to prevent damage of the semiconductor wafer.

As the above-described adhesive film, generally, a film obtained by laminating an ultraviolet-curable adhesive resin layer on a base material film is used. When this adhesive film is irradiated with ultraviolet rays, the adhesive resin layer cross-links, and the adhesive force of the adhesive resin layer decreases, and thus the adhesive film can be easily peeled off from the semiconductor wafer.

Meanwhile, in steps for manufacturing a semiconductor device using the above-described adhesive film, there have been cases in which static electricity called peeling charging is generated during the peeling of the adhesive film from the semiconductor wafer. There have been cases in which a circuit formed on the semiconductor wafer is broken due to the static electricity generated as described above (electrostatic breakdown) or a foreign substance such as dust is attached to a circuit formed on the semiconductor wafer.

Particularly, in response to an increase in the density of semiconductor wafers and a decrease in wire pitches in recent years, there has been a tendency that semiconductor wafers are likely to be affected by static electricity more than ever.

In consideration of the above-described circumstance, recently, for adhesive films used to prevent damage of semiconductor wafers in steps for manufacturing a semiconductor device, there has been a demand for the additional improvement in antistatic performance.

As a technique regarding an adhesive film for processing a semiconductor wafer as described above, for example, the technique described in Patent Document 1 (Japanese Unexamined Patent Publication No. 2011-210944) is exemplified.

Patent Document 1 describes an adhesive tape for processing an antistatic semiconductor which is an adhesive tape constituted of a base material film and a photocurable adhesive layer and includes an antistatic layer containing a conductive polymer in at least one surface of the base material film and an adhesive layer containing a photocurable unsaturated carbon bond in a molecule of a base polymer on the antistatic layer, in which a surface resistivity on the adhesive layer side before and after ultraviolet curing is $1\times10^6$ to $5\times10^{12}\Omega/\square$, a thickness of the adhesive layer is 20 to 250 µm, and a 90-degree peel adhesive force (based on JIS Z 0237: a peel rate is 50 mm/min) after the ultraviolet curing of the adhesive layer in a case in which the adhesive tape is attached to a silicon mirror wafer is 0.15 to 0.25 N/25 mm.

RELATED DOCUMENT

Patent Document

[Patent Document 1] Japanese Unexamined Patent Publication No. 2011-210944

SUMMARY OF THE INVENTION

Technical Problem

As described above in the section of the background art, recently, a technical level demanded regarding a viewpoint of a static electricity countermeasure for an adhesive film for processing a semiconductor wafer has been gradually rising.

According to the present inventors' studies, it has been clarified that, in an adhesive film having a base material film, an antistatic layer, and an adhesive layer laminated in this order as described in Patent Document 1, the antistatic property is not sufficiently satisfactory.

More specifically, it has been clarified that, in an adhesive film as described in Patent Document 1, the saturated electrostatic potential of the adhesive layer significantly increases after ultraviolet curing and the antistatic property significantly deteriorates.

The present invention has been made in consideration of the above-described circumstance and provides a method for manufacturing a semiconductor device in which the grinding of a semiconductor wafer can be stably carried out, the insulation breakdown of a circuit can be suppressed, and a semiconductor device having an excellent quality can be stably obtained.

Solution to Problem

The present inventors repeated intensive studies in order to achieve the above-described object. As a result, the present inventors found that, in the case of providing a layer constitution including a base material layer, an antistatic layer, and an adhesive resin layer including a conductive additive in this order as the layer constitution of an adhesive film, it is possible to suppress an increase in the saturated electrostatic potential of the adhesive film after ultraviolet curing and completed the present invention.

According to the present invention, methods for manufacturing a semiconductor device described below are provided.

[1]

A method for manufacturing a semiconductor device, including at least:

a step (A) of preparing a structure including a semiconductor wafer having a circuit-formed surface and an adhesive film attached to the circuit-formed surface side of the semiconductor wafer;

a step (B) of back grinding a surface on a side opposite to the circuit-formed surface side of the semiconductor wafer; and a step (C) of radiating ultraviolet rays to the adhesive film and then removing the adhesive film from the semiconductor wafer, in which, as the adhesive film, an adhesive film having a base material layer, an antistatic layer, and an adhesive resin layer including a conductive additive in this order is used, and the adhesive film is used so that the adhesive resin layer faces the circuit-formed surface side of the semiconductor wafer.

[2]

The method for manufacturing a semiconductor device according to [1], in which a bump electrode is formed on the circuit-formed surface of the semiconductor wafer.

[3]
The method for manufacturing a semiconductor device according to [1] or [2],
in which the adhesive resin layer includes an ultraviolet-curable adhesive resin.

[4]
The method for manufacturing a semiconductor device according to [3],
in which a content of the conductive additive in the adhesive resin layer is equal to or more than 0.01 parts by mass and equal to or less than 10 parts by mass with respect to 100 parts by mass of the ultraviolet-curable adhesive resin.

[5]
The method for manufacturing a semiconductor device according to any one of [1] to [4],
in which the conductive additive includes one type or two or more types selected from a cationic surfactant, an anionic surfactant, a non-ionic surfactant, an amphoteric surfactant, and an ion liquid.

[6]
The method for manufacturing a semiconductor device according to any one of [1] to [5],
in which a thickness of the adhesive resin layer is equal to or more than 5 μm and equal to or less than 550 μm.

[7]
The method for manufacturing a semiconductor device according to any one of [1] to [6],
in which the antistatic layer includes a conductive polymer.

[8]
The method for manufacturing a semiconductor device according to any one of [1] to [7],
in which an unevenness-absorbing resin layer is further provided between the base material layer and the antistatic layer.

[9]
The method for manufacturing a semiconductor device according to any one of [1] to [8],
in which, in the step (C), ultraviolet rays having a dose of equal to or more than 300 mJ/cm$^2$ are radiated to the adhesive film to photocure the adhesive resin layer and decrease an adhesive force of the adhesive resin layer, and then the adhesive film is removed from the semiconductor wafer.

[10]
The method for manufacturing a semiconductor device according to any one of [1] to [9],
in which a saturated electrostatic potential $V_1$ on a surface of the adhesive resin layer after ultraviolet curing, which is measured using the following method, is equal to or less than 1.0 kV.
(Method)
Ultraviolet rays having a main wavelength of 365 nm are radiated to the adhesive resin layer using a high-pressure mercury lamp in an environment of 25° C. at a radiation intensity of 100 mW/cm$^2$ and an ultraviolet amount of 1,080 mJ/cm$^2$, thereby photocuring the adhesive resin layer. Next, a voltage is applied to a surface of the adhesive resin layer for 30 seconds under conditions of an applied voltage of 10 kV, a distance between a specimen and electrodes of 20 mm, 25° C., and 50% RH, and the saturated electrostatic potential ($V_1$) of the surface of the adhesive resin layer is computed according to JIS L1094.

[11]
The method for manufacturing a semiconductor device according to any one of [1] to [10], in which a tack force of the surface of the adhesive resin layer after ultraviolet curing, which is measured using a method described below, is equal to or less than 0.1 N/cm$^2$.
(Method)
The adhesive resin layer of the adhesive film is attached to a polyimide film, and ultraviolet rays having a main wavelength of 365 nm are radiated from the base material layer side of the adhesive film using a high-pressure mercury lamp in an environment of 25° C. at a radiation intensity of 100 mW/cm$^2$ and an ultraviolet amount of 1,080 mJ/cm$^2$, thereby photocuring the adhesive resin layer. Next, the polyimide film is peeled off from the adhesive film, the tack force of the surface of the adhesive resin layer is measured using a method in which, using a probe tack tester as a measurement instrument, a probe having a diameter of 5 mm and the surface of the adhesive resin layer are brought into contact with each other at a rate of 10 mm/second and held in contact with each other at a contact load of 0.98 N/cm$^2$ for 10 seconds, and then the probe is peeled off from the surface of the adhesive resin layer in a vertical direction at a rate of 10 mm/second.

Advantageous Effects of Invention

According to the present invention, it is possible to provide a method for manufacturing a semiconductor device in which the grinding of a semiconductor wafer can be stably carried out, the insulation breakdown of a circuit can be suppressed, and a semiconductor device having an excellent quality can be stably obtained.

BRIEF DESCRIPTION OF THE DRAWINGS

The above-described object and other objects, characteristics, and advantages will be further clarified using a preferred embodiment described below and the accompanying drawings below.

DESCRIPTION OF EMBODIMENTS

Hereinafter, an embodiment of the present invention will be described using drawings. Meanwhile, in all of the drawings, similar constituent elements will be given a common reference sign and will not be repeated. In addition, the drawings are schematic views, and dimensional ratios do not match actual dimensional ratios. Meanwhile, unless particularly otherwise described, a numerical range "A to B" indicates equal to and more than A and equal to and less than B. In addition, in the present embodiment, "(meth)acryl" refers to acryl, methacryl, or both acryl and methacryl.

Figure 1:
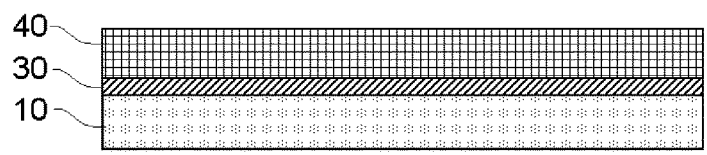
FIG. 1 is a cross-sectional view schematically showing an example of a structure of an adhesive film of an embodiment according to the present invention.
Figure 2:
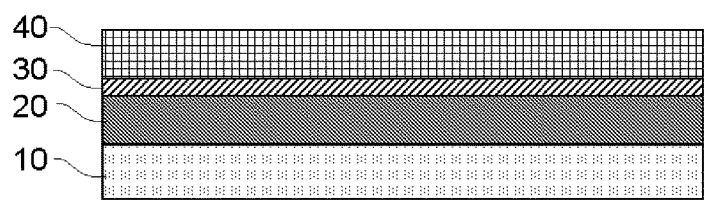
FIG. 2 is a cross-sectional view schematically showing an example of the structure of the adhesive film of the embodiment according to the present invention.

FIGS. 1 and 2 are cross-sectional views schematically showing examples of a structure of an adhesive film 100 of an embodiment according to the present invention.

A method for manufacturing a semiconductor device according to the present embodiment includes at least three steps described below.

A step (A) of preparing a structure including a semiconductor wafer having a circuit-formed surface and the adhesive film 100 attached to the circuit-formed surface side of the semiconductor wafer, A step (B) of back grinding a surface on a side opposite to the circuit-formed surface side of the semiconductor wafer, and A step (C) of radiating ultraviolet rays to the adhesive film 100 and then removing the adhesive film 100 from the semiconductor wafer.

In addition, as the adhesive film 100, an adhesive film having a base material layer 10, an antistatic layer 30, and an adhesive resin layer 40 including a conductive additive in this order is used, and the adhesive film is used so that the adhesive resin layer 40 faces the circuit-formed surface side of the semiconductor wafer.

1. Adhesive Film

First, the adhesive film 100 that is used in the method for manufacturing a semiconductor device according to the present embodiment will be described.

As described above, recently, the technical level demanded regarding a viewpoint of a static electricity countermeasure for an adhesive film for processing a semiconductor wafer has been gradually rising. Particularly, in the case of using a semiconductor wafer having bump electrodes such as solder bumps or copper pillar bumps formed on a high-density circuit of a semiconductor wafer on which a high-density circuit is disposed, there has been a tendency that the breakage (short) of the circuit including the bump electrodes formed on the semiconductor wafer is likely to occur due to static electricity, and thus the above-described demand has been further intensifying.

Therefore, there has been a demand for realizing an adhesive film for processing a semiconductor wafer having a more favorable antistatic property.

Here, according to the present inventors' studies, it has been clarified that, in an adhesive film having a base material film, an antistatic layer, and an adhesive layer laminated in this order as described in Patent Document 1, the antistatic property is not sufficiently satisfactory.

More specifically, it has been clarified that, in an adhesive film as described in Patent Document 1, the saturated electrostatic potential of the adhesive layer significantly increases after ultraviolet curing and the antistatic property significantly deteriorates.

The present inventors repeated intensive studies in order to achieve the above-described object. As a result, the present inventors found for the first time that, in the case of providing a layer constitution including a base material layer, an antistatic layer, and an adhesive resin layer including a conductive additive in this order as the layer constitution of an adhesive film, it is possible to suppress an increase in the saturated electrostatic potential of the adhesive film after ultraviolet curing.

That is, when the adhesive film 100 according to the present embodiment is provided with the above-described layer constitution, the adhesive film is excellent in terms of the antistatic property after ultraviolet curing and is capable of suppressing the amount of static electricity being generated when the adhesive film is peeled off from the semiconductor wafer, and it is possible to stably obtain a semiconductor component having an excellent quality.

In the adhesive film 100 according to the present embodiment, the saturated electrostatic potential $V_1$ of the adhesive resin layer 40 after ultraviolet curing, which is measured using the following method, is preferably equal to or less than 1.0 kV and more preferably equal to or less than 0.5 kV.

(Method)

Ultraviolet rays having a main wavelength of 365 nm are radiated to the adhesive resin layer 40 using a high-pressure mercury lamp in an environment of 25° C. at a radiation intensity of 100 mW/cm$^2$ and an ultraviolet amount of 1,080 mJ/cm$^2$, thereby photocuring the adhesive resin layer 40. Next, a voltage is applied to the surface of the adhesive resin layer 40 for 30 seconds under conditions of an applied voltage of 10 kV, a distance between a specimen and electrodes of 20 mm, 25° C., and 50% RH, and the saturated electrostatic potential ($V_1$) of the surface of the adhesive resin layer 40 is computed according to JIS L1094.

When the saturated electrostatic potential $V_1$ of the adhesive resin layer 40 after ultraviolet curing is set to equal to or less than the above-described upper limit value, it is possible to further improve the antistatic property of the semiconductor wafer surface.

The lower limit value of the saturated electrostatic potential $V_1$ of the adhesive resin layer 40 after ultraviolet curing is, for example, equal to or more than 0.01 kV and preferably 0 kV.

In the present embodiment, it is possible to control the saturated electrostatic potential $V_1$ of the adhesive resin layer 40 after ultraviolet curing to be equal to or less than the upper limit value by appropriately adjusting, for example, the kinds or blending proportions of individual components constituting the adhesive resin layer 40, the thickness of the adhesive resin layer 40, and the like.

Among these, for example, the presence or absence of the conductive additive in the adhesive resin layer 40, the thickness of the adhesive resin layer 40, and the like are exemplified as elements for setting the saturated electrostatic potential $V_1$ of the adhesive resin layer 40 after ultraviolet curing in a desired numerical range.

For example, when the content of the conductive additive in the adhesive resin layer 40 is increased or the thickness of the adhesive resin layer 40 is decreased, it is possible to decrease the saturated electrostatic potential $V_1$.

In the adhesive film 100 according to the present embodiment, when the saturated electrostatic potential of the surface of the adhesive resin layer 40 after ultraviolet curing, which is measured using a method described below, is represented by $V_2$, $V_1/V_2$ is preferably equal to or less than 5.0, more preferably equal to or less than 3.0, and still more preferably equal to or less than 2.5. When $V_1/V_2$ is equal to or less than the upper limit value, it is possible to more stably suppress the amount of static electricity being generated when the adhesive film is peeled off from the semiconductor wafer, and a semiconductor component having a more favorable quality can be stably obtained.

(Method)

Ultraviolet rays having a main wavelength of 365 nm are radiated to the adhesive resin layer 40 using a high-pressure mercury lamp in an environment of 25° C. at a radiation intensity of 100 mW/cm$^2$ and an ultraviolet amount of 200 mJ/cm$^2$, thereby photocuring the adhesive resin layer 40. Next, a voltage is applied to the surface of the adhesive resin layer 40 for 30 seconds under conditions of an applied voltage of 10 kV, a distance between a specimen and electrodes of 20 mm, 25° C., and 50% RH, and the saturated electrostatic potential ($V_2$) of the surface of the adhesive resin layer 40 is computed according to JIS L1094.

In the adhesive film 100 according to the present embodiment, the half-life of the saturated electrostatic potential $V_1$ of the adhesive resin layer 40 after ultraviolet curing is preferably equal to or shorter than 20 seconds, more preferably equal to or shorter than 10 seconds, still more preferably equal to or shorter than 5 seconds, and particularly preferably equal to or shorter than 1 second.

Here, the half-life of the saturated electrostatic potential $V_1$ refers to a period of time taken for the value of the electrostatic potential to decrease to half from the end of the application of the voltage to the surface of the adhesive resin layer 40 in the measurement of the saturated electrostatic potential $V_1$.

In the adhesive film 100 according to the present embodiment, the saturated electrostatic potential $V_1$ of the adhesive resin layer 40 after ultraviolet curing is equal to or less than the above-described upper limit value, and thus it is possible to realize a short half-life as described above and produce the adhesive film 100 having an excellent antistatic property.

In the adhesive film 100 according to the present embodiment, the tack force of the surface of the adhesive resin layer 40 after ultraviolet curing, which is measured using a method described below, is preferably equal to or less than 0.1 N/cm$^2$, more preferably equal to or less than 0.05 N/cm$^2$, and still more preferably equal to or less than 0.01 N/cm$^2$.

When the tack force of the surface of the adhesive resin layer 40 after ultraviolet curing is equal to or less than the above-described upper limit value, it becomes easier to peel the adhesive film 100 off from the semiconductor wafer surface, and it is possible to further suppress the remaining of a part of the adhesive resin layer 40 on the semiconductor wafer surface, the generation of disadvantages in the semiconductor wafer due to the peeling of the adhesive film 100, and the like.

(Method)

The adhesive resin layer 40 of the adhesive film 100 is attached to a polyimide film (for example, trade name: KAPTON 200H manufactured by DU PONT-TORAY CO., LTD.), ultraviolet rays having a main wavelength of 365 nm are radiated from the base material layer 10 side of the adhesive film 100 using a high-pressure mercury lamp in an environment of 25° C. at a radiation intensity of 100 mW/cm$^2$ and an ultraviolet amount of 1,080 mJ/cm$^2$, thereby photocuring the adhesive resin layer 40. Next, the polyimide film is peeled off from the adhesive film 100, and the tack force of the surface of the adhesive resin layer 40 is measured using a method in which, using a probe tack tester (for example, "a probe tack tester manufactured by TESTING MACHINES Inc.: model 80-02-01") as a measurement instrument, a probe having a diameter of 5 mm and the surface of the adhesive resin layer 40 are brought into contact with each other at a rate of 10 mm/second and held in contact with each other at a contact load of 0.98 N/cm$^2$ for 10 seconds, and then the probe is peeled off from the surface of the adhesive resin layer 40 in the vertical direction at a rate of 10 mm/second.

The thickness of the entire adhesive film 100 according to the present embodiment is preferably equal to or more than 25 μm and equal to or less than 1,000 μm and more preferably equal to or more than 50 μm and equal to or less than 600 μm in terms of the balance between the mechanical characteristics and the handleability.

The adhesive film 100 according to the present embodiment is used to protect the circuit-formed surface of the semiconductor wafer in steps for manufacturing a semiconductor device and, more specifically, used as a back grind tape that is used to protect the circuit-formed surface (that is, a circuit surface including a circuit pattern) of the semiconductor wafer in the back grind step which is one of the steps for manufacturing a semiconductor device.

Here, in a case in which the semiconductor wafer that is an attachment subject is a semiconductor wafer having a circuit of fine wires including bump electrodes formed on the surface, electrostatic breakdown or the like which is the breakage of a circuit formed on the semiconductor wafer due to static electricity being generated when the adhesive film is peeled off from the semiconductor wafer is likely to occur, but the use of the adhesive film 100 according to the present embodiment enables more reliable suppression of the electrostatic breakdown or the like in a semiconductor wafer having bump electrodes formed on the surface as described above.

Semiconductor wafers to which the adhesive film 100 according to the present embodiment can be applied are not particularly limited, and examples thereof include silicon wafers and the like.

Next, the respective layers constituting the adhesive film 100 according to the present embodiment will be described.

(Base Material Layer)

The base material layer 10 is a layer provided for the purpose of further improving the characteristics such as handleability, mechanical characteristics, and heat resistance of the adhesive film 100.

The base material layer 10 is not particularly limited as long as the base material layer has a mechanical strength high enough to withstand an external force being applied during the processing of the semiconductor wafer, and examples thereof include a resin film.

As a resin constituting the resin film, a well-known thermoplastic resin can be used. Examples thereof include one type or two or more types of resins selected from polyolefins such as polyethylene, polypropylene, poly(4-methyl-1-pentene), and poly(1-butene); polyesters such as polyethylene terephthalate, and polybutylene terephthalate; polyamides such as nylon-6, nylon-66, and polymethaxylene adipamide; polyacrylate; polymethacrylate; polyvinyl chloride; polyether imide; ethylene-vinyl acetate copolymers; polyacrylonitrile; polycarbonate; polystyrene; ionomers; polysulfone; polyethersulfone; polyphenylene ether; and the like.

Among these, from the viewpoint of the semiconductor wafer protection, one type or two or more types selected from polypropylene, polyethylene terephthalate, polyamide, and ethylene-vinyl acetate copolymers are preferred, and one type or two or more types selected from polyethylene terephthalate and an ethylene.vinyl acetate copolymer are more preferred.

The base material layer 10 may be a single layer or two or more kinds of layers.

In addition, the form of the resin film being used to form the base material layer 10 may be a stretched film or may be a film stretched in a monoaxial direction or a biaxial direction, but is preferably a film stretched in a monoaxial direction or a biaxial direction from the viewpoint of improving the mechanical strength of the base material layer 10.

The thickness of the base material layer 10 is preferably equal to or more than 10 μm and equal to or less than 500 μm, more preferably equal to or more than 20 μm and equal to or less than 300 μm, and still more preferably equal to or more than 25 μm and equal to or less than 150 μm from the viewpoint of obtaining favorable film characteristics.

In order to improve the adhesiveness to other layers, a surface treatment may be carried out on the base material layer 10. Specifically, a corona treatment, a plasma treatment, an undercoat treatment, a primer coat treatment, or the like may be carried out.

(Adhesive Resin Layer)

The adhesive film 100 according to the present embodiment includes the adhesive resin layer 40.

The adhesive resin layer 40 is a layer that is attached to a surface of the semiconductor wafer when the adhesive film 100 is attached to the semiconductor wafer.

The adhesive resin layer 40 is preferably a layer formed of an ultraviolet-curable adhesive including an ultraviolet-curable adhesive resin.

Examples of the ultraviolet-curable adhesive include a (meth)acrylic adhesive, a silicone-based adhesive, an urethane-based adhesive, and the like.

The (meth)acrylic adhesive includes, as the ultraviolet-curable adhesive resin, a (meth)acrylic adhesive resin as an essential component. The silicone-based adhesive includes, as the ultraviolet-curable adhesive resin, a silicone-based adhesive resin as an essential component. The urethane-based adhesive includes, as the ultraviolet-curable adhesive resin, an urethane-based adhesive resin as an essential component.

Among these, the (meth)acrylic adhesive is preferred from the viewpoint of facilitating the adjustment of the adhesive force.

As the (meth)acrylic adhesive, adhesives which include a (meth)acrylic adhesive resin having a polymerizable carbon-carbon double bond in the molecule, a low-molecular-weight compound having two or more polymerizable carbon-carbon double bonds in the molecule, and a photoinitiator and are obtained by cross-linking the (meth)acrylic adhesive resin using a crosslinking agent as necessary can be exemplified.

Specifically, the (meth)acrylic adhesive resin having a polymerizable carbon-carbon double bond in the molecule can be obtained as described below. First, a monomer having an ethylenic double bond and a copolymerizable monomer having a functional group (P) are copolymerized together. Next, the functional group (P) included in this copolymer and a monomer having a functional group (Q) capable of causing an addition reaction, a condensation reaction, or the like with the functional group (P) are reacted together while the double bond is left in the monomer, thereby introducing the polymerizable carbon-carbon double bond into the copolymer molecule.

As the monomer having an ethylenic double bond, for example, one type or two or more types selected from monomers having an ethylenic double bond such as acrylic acid alkyl ester and methacrylic acid alkyl ester monomers such as methyl (meth) acrylate, 2-ethylhexyl (meth)acrylate, butyl (meth)acrylate, and ethyl (meth)acrylate, vinyl esters such as vinyl acetate, and monomers having an ethylenic double bond such as (meth)acrylonitrile, (meth)acrylamide, and styrene are used.

As the copolymerizable monomer having a functional group (P), (meth)acrylic acid, maleic acid, 2-hydroxyethyl (meth)acrylate, glycidyl (meth)acrylate, N-methylol (meth) acrylamide, (meth)acryloyloxyethyl isocyanate, and the like are exemplified. These copolymerizable monomers may be used singly or two or more copolymerizable monomers may be used in combination. The proportions of the monomer having an ethylenic double bond and the copolymerizable monomer having a functional group (P) are preferably 70% to 99% by mass for the former monomer and 30% to 1% by mass for the latter monomer. The proportions are more preferably 80% to 95% by mass for the former monomer and 20% to 5% by mass for the latter monomer.

As the monomer having a functional group (Q), for example, the same monomers as the copolymerizable monomer having a functional group (P) can be exemplified.

The combination of the functional group (P) and the functional group (Q) which are reacted together when the polymerizable carbon-carbon double bond is introduced into the copolymer of the monomer having an ethylenic double bond and the copolymerizable monomer having a functional group (P) is desirably a combination that easily causes an addition reaction such as a carboxyl group and an epoxy group, a carboxyl group and an aziridyl group, or a hydroxyl group and an isocyanate group. Alternatively, the reaction is not limited to the addition reaction, and any reactions such as a condensation reaction between a carboxylic acid group and a hydroxyl group may also be used as long as the polymerizable carbon-carbon double bond can be easily introduced.

As the low-molecular-weight compound having two or more polymerizable carbon-carbon double bonds in the molecule, tripropylene glycol di(meth)acrylate, trimethylolpropane tri(meth)acrylate, tetramethylolmethane tetraacrylate, pentaerythritol tetra(meth)acrylate, dipentaerythritol monohydroxypenta (meth)acrylate, dipentaerythritol hexa (meth)acrylate, and the like. These compounds may be used singly or two or more compounds may be jointly used. The amount of the low-molecular-weight compound having two or more polymerizable carbon-carbon double bonds in the molecule added is preferably 0.1 to 20 parts by mass and more preferably 5 to 18 parts by mass with respect to 100 parts by mass of the (meth)acrylic adhesive resin.

As the photoinitiator, benzoin, isopropyl benzoin ether, isobutyl benzoin ether, benzophenone, Michler's ketone, chlorothioxanthone, dodecyl thioxanthone, dimethyl thioxanthone, diethyl thioxanthone, acetophenone diethyl ketal, benzyl dimethyl ketal, 1-hydroxy cyclohexyl phenyl ketone, 2-hydroxy-2-methyl-1-phenylpropan-1-one, and the like are exemplified. These photoinitiators may be used singly or two or more photoinitiators may be jointly used. The amount of the photoinitiator added is preferably 0.1 to 15 parts by mass and more preferably 5 to 10 parts by mass with respect to 100 parts by mass of the (meth)acrylic adhesive resin.

To the ultraviolet-curable adhesive, a crosslinking agent may be added. As the crosslinking agent, epoxy-based compounds such as sorbitol polyglycidyl ether, polyglycerol polyglycidyl ether, pentaerythritol polyglycidyl ether and diglycerol polyglycidyl ether, aziridine-based compounds such as tetramethylolmethane-tri-β-aziridinyl propionate, trimethylolpropane-tri-β-aziridinyl propionate, N,N'-diphenylmethane-4,4'-bis(1-aziridinecarboxamide), and N,N'-hexamethylene-1,6-bis(1-aziridinecarboxamide), isocyanate-based compounds such as tetramethylene diisocyanate, hexamethylene diisocyanate, and polyisocyanate, and the like are exemplified. The ultraviolet-curable adhesive may be any of a solvent-type adhesive, an emulsion-type adhesive, a hot melt-type adhesive, and the like.

The content of the crosslinking agent is, generally, preferably in a range in which the number of functional groups in the crosslinking agent does not exceed the number of functional groups in the (meth)acrylic adhesive resin. However, in a case in which functional groups are newly generated in a crosslinking reaction or a case in which the crosslinking reaction is slow, the ultraviolet-curable adhesive may excessively contain the crosslinking agent as necessary.

The content of the crosslinking agent in the (meth)acrylic adhesive resin is preferably equal to or more than 0.1 parts by mass and equal to or less than 15 parts by mass with respect to 100 parts by mass of the (meth)acrylic adhesive resin from the viewpoint of improving the balance with the heat resistance and adhesiveness of the adhesive resin layer 40.

The adhesive resin layer 40 according to the present embodiment includes a conductive additive. In such a case, it is possible to improve the antistatic property of the adhesive resin layer 40. Furthermore, it is possible to suppress an increase in the saturated electrostatic potential of the adhesive film 100 after ultraviolet curing.

Examples of the conductive additive include a cationic surfactant, an anionic surfactant, a non-ionic surfactant, an amphoteric surfactant, an ion liquid, and the like. From the viewpoint of further improving the antistatic property of the adhesive resin layer 40, at least one selected from a cationic surfactant and an anionic surfactant is preferred, and a cationic surfactant is more preferred.

Examples of the cationic surfactant include dodecyl trimethyl ammonium chloride, tetradecyl dimethyl benzyl ammonium chloride, cetyl dimethyl benzyl ammonium chloride, stearyl dimethyl benzyl ammonium chloride, tetradecyl trimethyl ammonium chloride, hexadecyl trimethyl ammonium chloride, octadecyl trimethyl ammonium chloride, didodecyl dimethyl ammonium chloride, ditetradecyl dimethyl ammonium chloride, dihexadecyl dimethyl ammonium chloride, dioctadecyl dimethyl ammonium chloride, dodecyl benzyl dimethyl ammonium chloride, hexadecyl benzyl dimethyl ammonium chloride, octadecyl benzyl dimethyl ammonium chloride, palmityl trimethyl ammonium chloride, oleyl trimethyl ammonium chloride, dipalmityl benzyl methyl ammonium chloride, dioleyl benzyl methyl ammonium chloride, and the like.

As the cationic surfactant, quaternary ammonium salts or amine salt-type surfactants can be exemplified, and quaternary ammonium salts are preferred.

Among these, at least one selected from tetradecyl dimethyl benzyl ammonium chloride, cetyl dimethyl benzyl ammonium chloride, and stearyl dimethyl benzyl ammonium chloride are preferred.

Among these, tetradecyl dimethyl benzyl ammonium chloride is particularly preferred.

Examples of the anionic surfactant include alkyl diphenyl ether disulfonates such as diammonium dodecyl diphenyl ether disulfonate, sodium dodecyl diphenyl ether disulfonate, calcium dodecyl diphenyl ether disulfonate, and sodium alkyl diphenyl ether disulfonate; alkylbenzenesulfonic acid salts such as sodium dodecylbenzenesulfonate and ammonium dodecylbenzenesulfonate; alkylsulfuric acid ester salts such as sodium lauryl sulfate and ammonium lauryl sulfate; aliphatic carboxylic acid salts such as sodium aliphatic acid and potassium oleate; polyoxyalkylene unit-containing sulfuric acid ester salts (for example, polyoxyethylene alkyl ether sulfuric acid ester salts such as sodium polyoxyethylene alkyl ether sulfate and ammonium polyoxyethylene alkyl ether sulfate; polyoxyethylene alkyl phenyl ether sulfuric acid ester salts such as sodium polyoxyethylene alkyl phenyl ether sulfate and ammonium polyoxyethylene alkyl phenyl ether sulfate; polyoxyethylene polycyclic phenyl ether sulfate salts such as sodium polyoxyethylene polycyclic phenyl ether sulfate, ammonium polyoxyethylene polycyclic phenyl ether sulfate, and the like); naphthalenesulfonic acid formalin condensate salts such as sodium naphthalenesulfonate formalin condensate; alkyl sulfosuccinates such as sodium dialkyl sulfosuccinate and disodium monoalkyl sulfosuccinate; polyoxyethylene-polyoxypropylene glycol ether sulfate; surfactants having a sulfonic acid salt or a sulfuric acid ester group and a polymerizable carbon-carbon (unsaturated) double bond in the molecule; and the like.

Examples of the non-ionic surfactant include polyoxyalkylene unit-containing ether compounds such as polyoxyalkylene alkyl ether compounds such as polyoxyethylene lauryl ether, polyoxyethylene stearyl ether, polyoxyethylene tridecyl ether, and polyoxyethylene oleyl ether, polyoxyalkylene alkyl phenyl ether compounds such as polyoxyethylene octyl phenyl ether and polyoxyethylene nonyl phenyl ether, and polyoxyalkylene polycyclic phenyl ether compounds such as polyoxyethylene polycyclic phenyl ether; polyoxyalkylene alkyl ester compounds such as polyoxyethylene monolaurate, polyoxyethylene monostearate, and polyoxyethylene monooleate; polyoxyalkylene alkylamine compounds such as polyoxyethylene alkylamine; sorbitan compounds such as sorbitan monolaurate, sorbitan monostearate, sorbitan trioleate, polyoxyethylene sorbitan monolaurate, and polyoxyethylene sorbitan monooleate; and the like.

As the amphoteric surfactant, lauryl betaine, lauryl dimethyl amine oxide, and the like are exemplified.

These conductive additives may be used singly or two or more ionic additives may be used in combination.

The content of the conductive additive in the adhesive resin layer 40 is preferably equal to or more than 0.01 parts by mass and equal to or less than 10 parts by mass, more preferably equal to or more than 0.1 parts by mass and equal to or less than 5 parts by mass and still more preferably equal to or more than 0.1 parts by mass and equal to or less than 2 parts by mass with respect to 100 parts by mass of the ultraviolet-curable adhesive resin.

The adhesive resin layer 40 can be formed by, for example, applying an adhesive coating fluid onto the antistatic layer 30.

As a method for applying the adhesive coating fluid, a well-known application method of the related art, for example, a roll coater method, a reverse roll coater method, a gravure roll method, a bar coat method, a comma coater method, or a die coater method can be employed. The conditions for drying the applied adhesive are not particularly limited; however, generally, the adhesive is preferably dried in a temperature range of 80° C. to 200° C. for 10 seconds to 10 minutes. More preferably, the adhesive is dried at 80° C. to 170° C. for 15 seconds to 5 minutes. In order to sufficiently accelerate a crosslinking reaction between the crosslinking agent and the (meth)acrylic adhesive resin, the adhesive coating fluid may be heated at 40° C. to 80° C. for approximately 5 to 300 hours after the end of the application of the adhesive coating fluid.

In the adhesive film 100 according to the present embodiment, the thickness of the adhesive resin layer 40 is generally equal to or more than 5 μm and equal to or less than 550 μm, preferably equal to or more than 10 μm and equal to or less than 400 μm, more preferably equal to or more than 30 μm and equal to or less than 300 μm, and particularly preferably equal to or more than 50 μm and equal to or less than 250 μm. When the thickness of the adhesive resin layer 40 is in the above-described range, the balance between the adhesiveness to the semiconductor wafer surface and the handleability is favorable.

In addition, in a case in which the adhesive film 100 according to the present embodiment further includes an unevenness-absorbing resin layer 20 described below, the thickness of the adhesive resin layer 40 is preferably equal to or less than 100 μm, more preferably equal to or less than 50 μm, still more preferably less than 30 μm, far still more preferably equal to or less than 25 μm, far still more preferably less than 20 μm, and particularly preferably equal to or less than 15 μm. In such a case, it is possible to decrease the distance between the surface of the adhesive resin layer 40 and the antistatic layer 30, and consequently, the antistatic property of the adhesive film 100 can be further improved. In addition, in a case in which the adhesive film 100 according to the present embodiment further includes the unevenness-absorbing resin layer 20 described below, the lower limit value of the thickness of the adhesive resin layer 40 is not particularly limited, but is preferably equal to or more than 0.5 μm, more preferably equal to or more than 1.0 μm, still more preferably equal to or more than 3.0 μm, and particularly preferably equal to or more than 5.0 μm from the viewpoint of improving the adhesive force.

(Antistatic Layer)

The adhesive film 100 according to the present embodiment includes the antistatic layer 30. In such a case, it is possible to improve the antistatic property of the adhesive film 100 while maintaining the adhesiveness of the adhesive film 100 and suppress the amount of static electricity being generated when the adhesive film 100 is peeled off from the semiconductor wafer.

A material constituting the antistatic layer 30 preferably includes a conductive polymer from the viewpoint of suppressing the generation of static electricity attributed to peeling by decreasing the surface resistance value of the antistatic layer 30.

Examples of the conductive polymer include polythiophene-based conductive polymers, polypyrrole-based conductive polymers, polyaniline-based conductive polymers, poly(p-phenylene vinylene)-based polymers, polyquinoxaline-based conductive polymers, and the like.

From the viewpoint of a favorable balance among the optical characteristics, the appearance, the antistatic property, the coatability, the stability, and the like, polythiophene-based conductive polymers are preferred. Examples of the polythiophene-based conductive polymers include polyethylene dioxythiophene and polythiophene.

These conductive polymers may be used singly or two or more conductive polymers may be used in combination.

A material forming the antistatic layer 30 may further include, for example, a doping agent, a binder resin, or the like.

The doping agent is an agent that functions as a dopant and more reliably imparts a conductive property (dopes) to the conductive polymer, and examples thereof include sulfonic acid-based compounds.

Examples of the sulfonic acid-based compounds include p-toluenesulfonic acid, benzenesulfonic acid, ethylbenzenesulfonic acid, octylbenzenesulfonic acid, dodecylbenzenesulfonic acid, mesitylenesulfonic acid, m-xylene sulfonic acid, polystyrenesulfonic acid, polyvinylsulfonic acid, and the like. From the viewpoint of improving the solubility and water dispersibility of the conductive polymer, polystyrenesulfonic acid and polyvinylsulfonic acid is preferred.

The sulfonic acid-based compound may be used singly or two or more sulfonic acid-based compounds may be used in combination.

When the doping agent is added to the material forming the antistatic layer as described above, the conductive polymer and the sulfonic acid-based compound partially react with each other so as to form a sulfonate, and, due to the action of this sulfonate, the antistatic function of the antistatic layer 30 further improves.

The blending proportion of the doping agent is, for example, 100 to 300 parts by mass with respect to 100 parts by mass of the conductive polymer.

As the combination of the conductive polymer and the doping agent, a combination of polyethylenedioxythiophene (PEDOT) and polystyrene sulfonic acid (PSS) is preferred since the antistatic property is more favorable.

A material constituting the antistatic layer 30 may further include a binder resin from the viewpoint of improving the film-forming property, the adhesiveness, or the like.

Examples of the binder resin include polyurethane-based resins, polyester-based resins, (meth) acrylic resins, polyether-based resins, cellulose-based resins, polyvinyl alcohol-based resins, epoxy resins, polyvinyl pyrrolidone, polystyrene-based resins, polyethylene glycol, pentaerythritol, and the like.

The binder resin may be used singly or two or more binder resins may be used in combination. The content of the binder resin is 10 to 500 parts by mass with respect to 100 parts by mass of the conductive polymer.

The thickness of the antistatic layer 30 is preferably equal to or more than 0.01 μm and equal to or less than 10 μm, more preferably equal to or more than 0.01 μm and equal to or less than 5 μm, and still more preferably equal to or more than 0.01 μm and equal to or less than 1 μm from the viewpoint of the antistatic performance.

(Unevenness-Absorbing Resin Layer)

As shown in FIG. 2, the adhesive film 100 according to the present embodiment preferably further includes the unevenness-absorbing resin layer 20 between the base material layer 10 and the antistatic layer 30.

In such a case, it becomes possible to decrease the thickness of the adhesive resin layer 40 while improving the unevenness-absorbing property of the adhesive film 100, the distance between the surface of the adhesive resin layer 40 and the antistatic layer 30 can be decreased, and consequently, it is possible to further improve the antistatic property of the adhesive film 100.

The density of the unevenness-absorbing resin layer 20 is preferably 800 to 990 kg/m$^3$, more preferably 830 to 980 kg/m$^3$, and still more preferably 850 to 970 kg/m$^3$ from the viewpoint of the balance between the mechanical strength and the unevenness followability.

A resin constituting the unevenness-absorbing resin layer 20 is not particularly limited as long as the resin exhibits an unevenness-absorbing property, and, for example, a thermoplastic resin can be used.

More specific examples thereof include olefin-based resins, ethylene.polar monomer copolymers, ABS resins, vinyl chloride resins, vinylidene chloride resins, (meth)acrylic resins, polyamide resins, fluorine-based resins, polycarbonate-based resins, polyester-based resins, and the like.

Among these, at least one selected from olefin-based resins and ethylene.polar monomer copolymers are preferred.

Examples of the olefin-based resins include linear low-density polyethylene (LLDPE), low-density polyethylene, high-density polyethylene, polypropylene, ethylene.α-olefin copolymers including ethylene and an α-olefin having 3 to 12 carbon atoms, propylene.α-olefin copolymers including propylene and an α-olefin having 4 to 12 carbon atoms, ethylene.cyclic olefin copolymers, ethylene.α-olefin.cyclic olefin copolymers, and the like.

Examples of the ethylene.polar monomer copolymers include ethylene.unsaturated carboxylic acid ester copolymers such as ethylene.ethyl (meth)acrylate copolymers, ethylene.methyl (meth)acrylate copolymers, ethylene.propyl (meth)acrylate copolymers, and ethylene.butyl (meth)acrylate copolymers; ethylene.vinyl ester copolymers such as ethylene.vinyl acetate copolymers, ethylene.vinyl propionate copolymers, ethylene.vinyl butyrate copolymers, and ethylene vinyl stearate copolymers; and the like.

The resin constituting the unevenness-absorbing resin layer 20 may be used singly or two or more resins may be blended together and used.

Examples of the α-olefin having 3 to 12 carbon atoms in the ethylene.α-olefin copolymers include propylene, 1-butene, 1-pentene, 3-methyl-1-butene, 1-hexene, 4-methyl-1-pentene, 3-methyl-1-pentene, 1-heptene, 1-octene, 1-decene, 1-dodecene, and the like, and propylene, 1-butene, and the like are preferred.

Among these, due to the excellent unevenness followability during attachment, at least one selected from low-density polyethylene; polypropylene; ethylene propylene copolymers, ethylene.1-butene copolymers, ethylene.α-olefin copolymers such as three-membered copolymers of ethylene, propylene, and an α-olefin having 4 to 12 carbon atoms; three-membered copolymers of propylene, 1-butene, and an α-olefin having 5 to 12 carbon atoms; ethylene.vinyl acetate copolymers; and the like are preferred, and at least one selected from ethylene.propylene copolymers and ethylene.vinyl acetate copolymers are more preferred.

The thickness of the unevenness-absorbing resin layer 20 is not particularly limited as long as it is possible to fill unevenness on an unevenness-formed surface of the semiconductor wafer; however, for example, is preferably equal to or more than 10 μm and equal to or less than 500 μm, more preferably equal to or more than 20 μm and equal to or less than 400 μm, still more preferably equal to or more than 30 μm and equal to or less than 300 μm, and particularly preferably equal to or more than 50 μm and equal to or less than 250 μm.

In the adhesive film 100 according to the present embodiment, an adhesive layer (not shown) may be provided between the respective layers. According to this adhesive layer, it is possible to improve the adhesive property between the respective layers.

In addition, on the adhesive film 100 according to the present embodiment, a mold-release film may be further laminated.

Next, a method for manufacturing the adhesive film 100 according to the present embodiment will be described.

First, the unevenness-absorbing resin layer 20 is formed on one surface of the base material layer 10 using an extrusion lamination method. Next, a predetermined conductive material is applied and dried on a separately-prepared mold-release film, thereby forming the antistatic layer 30, and this antistatic layer 30 is laminated on the unevenness-absorbing resin layer 20. Next, the adhesive coating fluid is applied and dried on the antistatic layer 30, thereby forming the adhesive resin layer 40 and thus obtaining the adhesive film 100.

In addition, the base material layer 10 and the unevenness-absorbing resin layer 20 may be formed by co-extrusion molding or the film-like base material layer 10 and the film-like unevenness-absorbing resin layer 20 may be formed by lamination.

2. Method for Manufacturing Semiconductor Device

Next, individual steps of the method for manufacturing a semiconductor device according to the present embodiment will be described.

(Step (A))

First, a structure including the semiconductor wafer having the circuit-formed surface and the adhesive film 100 attached to the circuit-formed surface side of the semiconductor wafer is prepared.

A structure as described above can be produced by, for example, peeling the mold-release film off from the adhesive resin layer 40 of the adhesive film 100, exposing the surface of the adhesive resin layer 40, and attaching the circuit-formed surface of the semiconductor wafer onto this adhesive resin layer 40.

Here, conditions for attaching the circuit-formed surface of the semiconductor wafer to the adhesive film 100 are not particularly limited, and, for example, it is possible to set the temperature to 30° C. to 80° C. and the pressure to 0.05 to 0.5 MPa.

The step (A) preferably further includes a step (A2) of producing a structure by attaching the adhesive film 100 to the circuit-formed surface of the semiconductor wafer by heating. In such a case, it is possible to favorably maintain the attachment state between the adhesive resin layer 40 and the semiconductor wafer for a long period of time. The heating temperature is not particularly limited and, for example, 60° C. to 80° C.

An operation of attaching the adhesive film 100 to the semiconductor wafer is carried out manually in some cases; however, generally, the operation can be carried out using an apparatus called an automatic attachment device in which a roll-shaped adhesive film is mounted.

The semiconductor wafer having the circuit-formed surface is not particularly limited, and examples thereof include a silicon wafer, a silicon carbide wafer, a compound semiconductor wafer, a sapphire wafer, and the like on which a circuit such as a wire, a capacitor, a diode, or a transistor is formed.

(Step (B))

Next, a surface on a side opposite to the circuit-formed surface side of the semiconductor wafer (hereinafter, also referred to as the rear surface) is back ground.

Here, the back grinding refers to a process of thinning the semiconductor wafer to a predetermined thickness without cracking or impairing the semiconductor wafer.

For example, the structure is fixed to a chuck table or the like of a grinding machine, and the rear surface (circuit-non-formed surface) of the semiconductor wafer is ground.

In the above-described rear surface-grinding operation, the semiconductor wafer is ground to, generally, approximately 100 to 600 μm depending on the kind or the like of a semiconductor chip from a thickness before grinding of, generally, 500 to 1,000 μm. There are cases in which the semiconductor wafer is ground to be thinner than 100 μm as necessary. The thickness of the semiconductor wafer before grinding is appropriately determined depending on the diameter, kind, or the like of the semiconductor wafer, and the thickness of the wafer after grinding is appropriately determined depending on the size of a chip to be obtained, the kind of a circuit, or the like.

As a rear surface-grinding method, a well-known grinding method such as a through feed method or an infeed method is employed. In each of the grinding methods, the rear surface is ground while being cooled by applying water to the semiconductor wafer and a grind stone.

After the end of rear surface grinding, chemical etching is carried out as necessary. The chemical etching is carried out using a method in which the semiconductor wafer to which the adhesive film 100 is attached is immersed in an etching fluid selected from the group consisting of acidic aqueous solutions made of hydrofluoric acid, nitric acid, sulfuric acid, acetic acid, or the like or a liquid mixture thereof and alkaline aqueous solutions such as a potassium hydroxide aqueous solution and a sodium hydroxide aqueous solution. The etching is carried out for the purpose of the removal of distortion generated on the semiconductor wafer rear surface, the additional thinning of the wafer, the removal of an oxidized film or the like, a pretreatment during the formation of electrodes on the rear surface, and the like. The etching fluid is appropriately selected depending on the above-described purpose.

(Step (C))

Next, ultraviolet rays are radiated to the adhesive film 100, and then the adhesive film 100 is removed from the semiconductor wafer.

When ultraviolet rays are radiated to the adhesive film 100, the adhesive resin layer 40 is photocured, and thus the adhesive force of the adhesive resin layer 40 decreases. Therefore, it is possible to peel the adhesive film 100 from the semiconductor wafer.

The ultraviolet rays are radiated to, for example, the base material layer 10 side of the adhesive film 100.

The dose of the ultraviolet rays being radiated to the adhesive film 100 is preferably equal to or more than 300 mJ/cm$^2$, more preferably equal to or more than 350 mJ/cm$^2$, and still more preferably equal to or more than 500 mJ/cm$^2$.

When the dose of the ultraviolet rays is equal to or more than the above-described lower limit value, it is possible to sufficiently decrease the adhesive force of the adhesive resin layer 40, and consequently, it is possible to further suppress the generation of an adhesive deposit on the circuit-formed surface of the semiconductor wafer.

In addition, the upper limit of the dose of the ultraviolet rays being radiated to the adhesive film 100 is not particularly limited, but is preferably equal to or less than 1,500 mJ/cm$^2$ and more preferably equal to or less than 1,200 mJ/cm$^2$ from the viewpoint of the productivity.

After ultraviolet rays are radiated to the adhesive film 100, and the adhesive force of the adhesive resin layer 40 is decreased, the adhesive film 100 is peeled off from the semiconductor wafer.

There are cases in which the chemical etching step is carried out after the completion of the grinding of the rear surface of the semiconductor wafer and before the peeling of the adhesive film 100. In addition, a treatment such as water washing or plasma washing is carried out on the semiconductor wafer surface as necessary after the peeling of the adhesive film 100.

There are cases in which the adhesive film 100 is manually peeled off; however, generally, the adhesive film can be peeled off using an apparatus called an automatic peeling device.

The semiconductor wafer surface from which the adhesive film 100 has been peeled off is washed as necessary. As a washing method, wet-type washing such as water washing or solvent washing, dry-type washing such as plasma washing, and the like are exemplified. In the case of the wet-type washing, ultrasonic washing may be jointly used. These washing methods are appropriately selected depending on the contamination status of the semiconductor wafer surface.

(Other Steps)

After the step (A) to the step (C) are carried out, a step of obtaining semiconductor chips by individualizing the semiconductor wafer by dicing, a step of mounting the obtained semiconductor chips on a circuit board, and the like may be further carried out. These steps can be carried out on the basis of well-known information.

Hitherto, the embodiment of the present invention has been described, but this is an example of the present invention, and a variety of other constitutions can also be employed.

EXAMPLES

Hereinafter, the present invention will be specifically described using examples and comparative examples, but the present invention is not limited thereto.

The details of materials used to produce an adhesive film are as described below.

<Base Material Layer>

Polyethylene terephthalate film (thickness: 50 μm)

<Resin for Forming Unevenness-Absorbing Resin Layer>

Unevenness-absorbing resin layer 1: An ethylene.vinyl acetate copolymer (density: 960 kg/m$^3$, "EVAFLEX EV150" manufactured by Du Pont Mitsui Polychemicals Co., Ltd.)

<Material for Forming Antistatic Layer>

Material for forming the antistatic layer 1: A conductive material including polyethylenedioxythiophene/polystyrene sulfonic acid (PEDOT/PSS) (manufactured by Nagase ChemteX Corporation, trade name: DENATRON P-504CT)

<Conductive Additive>

Conductive additive 1: Tetradecyl dimethyl benzyl ammonium chloride (manufactured by NOF Corporation, trade name: NISSAN CATION M2-100)

<Photoinitiator>

Photoinitiator 1: Benzyl dimethyl ketal (manufactured by BASF, trade name: IRGACURE 651)

<Coating Fluid for Adhesive Resin Layer 1> n-Butyl acrylate (77 parts by mass), methyl methacrylate (16 parts by mass), 2-hydroxyethyl acrylate (16 parts by mass), and benzoyl peroxide (0.5 parts by mass) as a polymerization initiator were mixed together. The mixture was added dropwise to a nitrogen-substituted flask filled with toluene (20 parts by mass) and ethyl acetate (80 parts by mass) under stirring at 85° C. for five hours, and, furthermore, the components were stirred for five hours and thus reacted. After the end of the reaction, this solution was cooled, toluene (10 parts by mass), methacryloyloxyethyl isocyante (manufactured by Showa Denko K.K., trade name: KARENZ MOI) (7 parts by mass), and dibutyltin dilaurate (0.02 parts by mass) were added to the solution, and the components were reacted at 85° C. for 12 hours under the injection of the air, thereby obtaining an adhesive polymer 1 solution into which a polymerizable carbon-carbon double bond had been introduced.

To this solution, benzyl dimethyl ketal (manufactured by BASF, trade name: IRGACURE 651) (7 parts by mass) as the photoinitiator, an isocyanate-based crosslinking agent (manufactured by Mitsui Chemicals Inc., trade name: OLESTER P49-75S) (2 parts by mass), dipentaerythritol hexaacrylate (manufactured by Toagosei Co., Ltd., trade name: ARONIX M-400) (12 parts by mass) as a low-molecular-weight compound having two or more polymerizable carbon-carbon double bonds in a molecule, and the conductive additive 1: tetradecyl dimethyl benzyl ammonium chloride (manufactured by NOF Corporation, trade name: NISSAN CATION M$_2$-100) (0.5 parts by mass) with respect to 100 parts by mass (solid content) of a copolymer were added, thereby obtaining a coating fluid for an adhesive resin layer 1.

<Coating Fluid for Adhesive Resin Layer 2>

A coating fluid for an adhesive resin layer 2 was obtained in the same manner as for the coating fluid for an adhesive resin layer 1 except for the fact that the conductive additive 1 was not added.

<Coating Fluid for Adhesive Resin Layer 3>

Ethyl acrylate (48 parts by mass), 2-ethylhexyl acrylate (27 parts by mass), methyl acrylate (20 parts by mass), glycidyl methacrylate (5 parts by mass), and benzoyl peroxide (0.5 parts by mass) as a polymerization initiator were mixed together. The mixture was added dropwise to a nitrogen-substituted flask filled with toluene (65 parts by mass) and ethyl acetate (50 parts by mass) under stirring at 80° C. for five hours, and, furthermore, the components were stirred for five hours and thus reacted. After the end of the reaction, this solution was cooled, xylene (25 parts by mass), acrylic acid (2.5 parts by mass), and the conductive additive 1: tetradecyl dimethyl benzyl ammonium chloride (0.5 parts by mass) were added to the solution, and the components were reacted at 85° C. for 32 hours under the injection of the air, thereby obtaining an adhesive polymer 3 solution into which a polymerizable carbon-carbon double bond had been introduced.

To this solution, benzyl dimethyl ketal (manufactured by BASF, trade name: IRGACURE 651) (7 parts by mass) as the photoinitiator, an isocyanate-based crosslinking agent (manufactured by Mitsui Chemicals Inc., trade name: OLESTER P49-75S) (2 parts by mass), and dipentaerythritol hexaacrylate (manufactured by Toagosei Co., Ltd., trade name: ARONIXM-400) (12 parts by mass) as a low-molecular-weight compound having two or more polymerizable carbon-carbon double bonds in a molecule with respect to 100 parts by mass (solid content) of a copolymer were added, thereby obtaining a coating fluid for an adhesive resin layer 3.

Example 1

An unevenness-absorbing resin 1 which served as the unevenness-absorbing resin layer was extrusion-laminated on a polyethylene terephthalate which served as the base material layer in a thickness of 195 μm, thereby obtaining a bilayer laminate film.

Next, the material for forming the antistatic layer 1 was applied onto and dried on a separately-prepared mold-release film to form an antistatic film, and this antistatic film was laminated on the unevenness-absorbing resin layer, thereby forming a 0.1 μm-thick antistatic layer.

Next, the coating fluid for an adhesive resin layer 1 was applied and then dried on the antistatic layer of the obtained laminate film, thereby forming a 40 μm-thick adhesive resin layer and thus obtaining an adhesive film.

The following evaluations were carried out on the obtained adhesive film. The obtained results are shown in Table 1.

Examples 2 and 3 and Comparative Examples 1 to 4

Adhesive films were produced respectively in the same manner as in Example 1 except for the fact that the presence or absence of the formation of the antistatic layer, the thickness of the adhesive resin layer, the kind of the coating fluid for an adhesive resin layer, and the like were changed as shown in Table 1.

The following evaluations were carried out respectively on the obtained adhesive films. The obtained results are shown in Table 1 respectively.

<Evaluations>

(1) Measurement of Saturated Electrostatic Potential

Ultraviolet rays having a main wavelength of 365 nm were radiated to the adhesive resin layer in the adhesive film using a high-pressure mercury lamp (UVX-02528S1AJA02 manufactured by Ushio Inc.) in an environment of 25° C. at a radiation intensity of 100 mW/cm$^2$ and an ultraviolet amount of 1,080 mJ/cm$^2$, thereby photocuring the adhesive resin layer. Next, using a static honestmeter H-0110-S4 manufactured by Shishido Electrostatic, Ltd. as a measurement instrument, a voltage was applied to a surface of the adhesive resin layer for 30 seconds under conditions of an applied voltage of 10 kV, a distance between a specimen and electrodes of 20 mm, 25° C., and 50% RH, and the saturated electrostatic potential ($V_1$) of the surface of the adhesive resin layer and the half-life of the saturated electrostatic potential $V_1$ were computed respectively according to JIS L1094.

The saturated electrostatic potential of the surface of the adhesive resin layer and the half-life of the saturated electrostatic potential were measured respectively in the same order as in the measurement of the saturated electrostatic potential ($V_1$) except for the fact that the ultraviolet amount was changed to 200 to 540 mJ/cm$^2$.

(2) Measurement of Tack Force

The adhesive resin layer of the adhesive film was attached to a polyimide film (trade name: KAPTON 200H manufactured by DU PONT-TORAY CO., LTD.), ultraviolet rays having a main wavelength of 365 nm were radiated from the base material layer side of the adhesive film using a high-pressure mercury lamp in an environment of 25° C. at a radiation intensity of 100 mW/cm$^2$ and an ultraviolet amount of 1,080 mJ/cm$^2$, thereby photocuring the adhesive resin layer. Next, the polyimide film was peeled off from the adhesive film, and the tack force of the surface of the adhesive resin layer was measured using a method in which, using a probe tack tester (for example, "a probe tack tester manufactured by TESTING MACHINES Inc.: model 80-02-01") as a measurement instrument, a probe having a diameter of 5 mm and the surface of the adhesive resin layer were brought into contact with each other at a rate of 10 mm/second and held in contact with each other at a contact load of 0.98 N/cm$^2$ for 10 seconds, and then the probe was peeled off from the surface of the adhesive resin layer in the vertical direction at a rate of 10 mm/second.

The tack force of the surface of the adhesive resin layer was measured in the same order as in the measurement of the tack force except for the fact that the ultraviolet amount was changed to 200 to 540 mJ/cm$^2$.

(3) Evaluation of Antistatic Property

The antistatic property of the adhesive film was evaluated using the following standards.

AA: The saturated electrostatic potential $V_1$ was equal to or less than 1.0 kV.

A: The saturated electrostatic potential $V_1$ was more than 1.0 kV and equal to or less than 2.0 kV.

B: The saturated electrostatic potential $V_1$ was more than 2.0 kV.

(4) Evaluation of Adhesiveness to Semiconductor Wafer Surface

The adhesiveness to the semiconductor wafer surface was evaluated using the following standards.

A: The tack force of the adhesive resin layer to which no ultraviolet rays were radiated (that is, the ultraviolet amount was 0 mJ/cm$^2$) was equal to or more than 10 N/cm$^2$.

B: The tack force of the adhesive resin layer to which no ultraviolet rays were radiated was less than 10 N/cm$^2$.

(5) Evaluation of Contamination Resistance on Semiconductor Wafer Surface

The contamination resistance on the semiconductor wafer surface was evaluated using the following standards.

A: The tack force of the adhesive resin layer photocured by the radiation with an ultraviolet amount of 1,080 mJ/cm$^2$ was equal to or less than 0.1 N/cm$^2$.

B: The tack force of the adhesive resin layer photocured by the radiation with an ultraviolet amount of 1,080 mJ/cm$^2$ was more than 0.1 N/cm$^2$.

(6) Evaluation of Unevenness-Absorbing Property

A: When the adhesive film was attached to the bump electrode-formed surface of the semiconductor wafer having the bump electrode, the bump electrode did not break, and the adhesive property with the semiconductor wafer was favorable.

B: When the adhesive film was attached to the bump electrode-formed surface of the semiconductor wafer having the bump electrode, the bump electrode broke or the adhesive property with the semiconductor wafer was poor.

In the evaluation of the unevenness-absorbing property, a bump-attached semiconductor wafer on which bumps having a bump height of 80 µm, a bump pitch of 300 µm, and a bump diameter of 150 µm were disposed was used, the adhesive films were attached using a roll laminator (trade name: DR3000II, manufactured by NITTO SEIKI CO., LTD.) under conditions of a roll speed of 2 mm/second, a roll pressure of 0.4 MPa, and a table temperature of 80° C., and the unevenness-absorbing property after attachment was evaluated using an optical microscope.

In contrast, the adhesive films of Comparative Examples 1 to 3 in which the adhesive resin layer did not include the conductive additive and the adhesive films of Comparative Examples 3 and 4 which did not include the antistatic layer were poor in terms of the antistatic property.

Priority is claimed on the basis of Japanese Patent Application No. 2016-146134 filed on Jul. 26, 2016, the content of which is incorporated herein by reference.

The invention claimed is:

1. A method for manufacturing a semiconductor device, comprising at least:

a step (A) of preparing a structure including a semiconductor wafer having a circuit-formed surface and an adhesive film attached to the circuit-formed surface side of the semiconductor wafer;

a step (B) of back grinding a surface on a side opposite to the circuit-formed surface side of the semiconductor wafer; and

TABLE 1

| | | Example 1 | Example 2 | Example 3 | Comparative Example 1 | Comparative Example 2 | Comparative Example 3 | Comparative Example 4 |
|---|---|---|---|---|---|---|---|---|
| Base material layer | Thickness [µm] | 50 | 50 | 50 | 50 | 50 | 50 | 50 |
| Unevenness-absorbing resin layer | Presence or absence | Present | Present | Present | Present | Present | Present | Present |
| | Thickness [µm] | 195 | 195 | 195 | 195 | 195 | 195 | 195 |
| Antistatic layer | Presence or absence | Present | Present | Present | Present | Present | Absent | Absent |
| | Thickness [µm] | 0.1 | 0.1 | 0.1 | 0.1 | 0.1 | — | — |
| Adhesive resin layer | Kind | Coating fluid 1 | Coating fluid 1 | Coating fluid 3 | Coating fluid 2 | Coating fluid 2 | Coating fluid 2 | Coating fluid 3 |
| | Presence or absence of conductive additive | Present | Present | Present | Absent | Absent | Absent | Present |
| | Thickness [µm] | 40 | 80 | 40 | 40 | 80 | 10 | 40 |
| Saturated electrostatic potential [kV] | 0 mJ/cm$^2$ | 0.05 | 0.08 | 0.05 | 0.86 | 1.4 | 2.7 | 2.5 |
| | 200 mJ/cm$^2$ ($V_2$) | 0.38 | 0.51 | 0.24 | 2.3 | 2.6 | 2.6 | 2.5 |
| | 360 mJ/cm$^2$ | 0.42 | 0.63 | 0.41 | 2.3 | 2.9 | 2.6 | 2.5 |
| | 540 mJ/cm$^2$ | 0.53 | 0.76 | 0.43 | 2.5 | 3.0 | 2.6 | 2.5 |
| | 1,080 mJ/cm$^2$ ($V_1$) | 0.66 | 0.93 | 0.49 | 2.8 | >3.0 | 2.6 | 2.5 |
| Half-life of saturated electrostatic potential [seconds] | 0 mJ/cm$^2$ | 0.00 | 0.00 | <0.1 | 0.71 | 0.82 | >120 | >120 |
| | 200 mJ/cm$^2$ | 0.17 | 0.15 | 0.11 | 10 | 13 | >120 | >120 |
| | 360 mJ/cm$^2$ | 0.24 | 0.22 | 0.25 | 17 | 29 | >120 | >120 |
| | 540 mJ/cm$^2$ | 0.35 | 0.30 | 0.31 | 24 | 40 | >120 | >120 |
| | 1080 mJ/cm$^2$ | 0.50 | 0.47 | 0.39 | 43 | 83 | >120 | >120 |
| Tack force [N/cm$^2$] | 0 mJ/cm$^2$ | 29 | 45 | 17.5 | 30 | 42 | 22.5 | 17.5 |
| | 200 mJ/cm$^2$ | 4.7 | 6.7 | 1.7 | 4.5 | 6.5 | 2.1 | 1.7 |
| | 360 mJ/cm$^2$ | 0.9 | 1.2 | 0.2 | 0.9 | 1.1 | 0.6 | 0.2 |
| | 540 mJ/cm$^2$ | 0 | 0 | 0 | 0 | 0 | 0 | 0 |
| | 1,080 mJ/cm$^2$ | 0 | 0 | 0 | 0 | 0 | 0 | 0 |
| Evaluation results | Antistatic property | AA | AA | AA | B | B | B | B |
| | Adhesiveness | A | A | A | A | A | A | A |
| | Contamination resistance | A | A | A | A | A | A | A |
| | Unevenness-absorbing property | A | A | A | A | A | A | A |

The adhesive films of Examples 1 to 3 in which the base material layer, the antistatic layer, and the adhesive resin layer were provided in this order and the adhesive resin layer included the conductive additive were excellent in terms of the balance between the adhesion to the semiconductor wafer surface and the contamination resistance and were also excellent in terms of the antistatic property. That is, it is possible to understand that, according to the adhesive film 100 according to the present embodiment, the adhesive film is excellent in terms of the antistatic property after ultraviolet curing and is capable of suppressing the amount of static electricity being generated when the adhesive film is peeled off from the semiconductor wafer and it is possible to stably obtain a semiconductor component having an excellent quality.

a step (C) of radiating ultraviolet rays to the adhesive film and then removing the adhesive film from the semiconductor wafer, wherein, as the adhesive film, an adhesive film having a base material layer, an antistatic layer, and an adhesive resin layer including a conductive additive in this order is used, and the adhesive film is used so that the adhesive resin layer faces the circuit-formed surface side of the semiconductor wafer.

2. The method for manufacturing a semiconductor device according to claim 1, wherein a bump electrode is formed on the circuit-formed surface of the semiconductor wafer.

3. The method for manufacturing a semiconductor device according to claim 1, wherein the adhesive resin layer includes an ultraviolet-curable adhesive resin.

4. The method for manufacturing a semiconductor device according to claim 3,
wherein a content of the conductive additive in the adhesive resin layer is equal to or more than 0.01 parts by mass and equal to or less than 10 parts by mass with respect to 100 parts by mass of the ultraviolet-curable adhesive resin.

5. The method for manufacturing a semiconductor device according to claim 1,
wherein the conductive additive includes one type or two or more types selected from a cationic surfactant, an anionic surfactant, a non-ionic surfactant, an amphoteric surfactant, and an ion liquid.

6. The method for manufacturing a semiconductor device according to claim 1,
wherein a thickness of the adhesive resin layer is equal to or more than 5 μm and equal to or less than 550 μm.

7. The method for manufacturing a semiconductor device according to claim 1,
wherein the antistatic layer includes a conductive polymer.

8. The method for manufacturing a semiconductor device according to claim 1,
wherein an unevenness-absorbing resin layer is further provided between the base material layer and the antistatic layer.

9. The method for manufacturing a semiconductor device according to claim 1,
wherein, in the step (C), ultraviolet rays having a dose of equal to or more than 300 mJ/cm$^2$ are radiated to the adhesive film to photocure the adhesive resin layer and decrease an adhesive force of the adhesive resin layer, and then the adhesive film is removed from the semiconductor wafer.

10. The method for manufacturing a semiconductor device according to claim 1,
wherein a saturated electrostatic potential $V_1$ on a surface of the adhesive resin layer after ultraviolet curing, which is measured using the following method, is equal to or less than 1.0 kV, and
wherein ultraviolet rays having a main wavelength of 365 nm are radiated to the adhesive resin layer using a high-pressure mercury lamp in an environment of 25° C. at a radiation intensity of 100 mW/cm$^2$ and an ultraviolet amount of 1,080 mJ/cm$^2$, thereby photocuring the adhesive resin layer, and then a voltage is applied to a surface of the adhesive resin layer for 30 seconds under conditions of an applied voltage of 10 kV, a distance between a specimen and electrodes of 20 mm, 25° C., and 50% RH, and the saturated electrostatic potential ($V_1$) of the surface of the adhesive resin layer is computed according to JIS L1094.

11. The method for manufacturing a semiconductor device according to claim 1,
wherein a tack force of the surface of the adhesive resin layer after ultraviolet curing, which is measured using a method described below, is equal to or less than 0.1 N/cm$^2$, and
wherein the adhesive resin layer of the adhesive film is attached to a polyimide film, ultraviolet rays having a main wavelength of 365 nm are radiated from the base material layer side of the adhesive film using a high-pressure mercury lamp in an environment of 25° C. at a radiation intensity of 100 mW/cm$^2$ and an ultraviolet amount of 1,080 mJ/cm$^2$, thereby photocuring the adhesive resin layer, and then the polyimide film is peeled off from the adhesive film, and the tack force of the surface of the adhesive resin layer is measured using a method in which, using a probe tack tester as a measurement instrument, a probe having a diameter of 5 mm and the surface of the adhesive resin layer are brought into contact with each other at a rate of 10 mm/second and held in contact with each other at a contact load of 0.98 N/cm$^2$ for 10 seconds, and then the probe is peeled off from the surface of the adhesive resin layer in a vertical direction at a rate of 10 mm/second.

\* \* \* \* \*